(12) United States Patent
Alfsmann et al.

(10) Patent No.: US 8,085,960 B2
(45) Date of Patent: Dec. 27, 2011

(54) FILTER BANK SYSTEM FOR HEARING AIDS

(75) Inventors: Daniel Alfsmann, Bochum (DE);
Professor Heinz Goeckler, Backnang (DE)

(73) Assignee: Siemens Medical Instruments Pte Ltd, Singapore (SG)

( * ) Notice: Subject to any disclaimer, the term of this patent is extended or adjusted under 35 U.S.C. 154(b) by 410 days.

(21) Appl. No.: 12/467,579

(22) Filed: May 18, 2009

(65) Prior Publication Data

US 2009/0290736 A1    Nov. 26, 2009

(30) Foreign Application Priority Data

May 21, 2008   (DE) .......................... 10 2008 024 490

(51) Int. Cl.
  *H04R 25/00*   (2006.01)
(52) U.S. Cl. ........................................ 381/320; 381/323
(58) Field of Classification Search ................. 381/23.1, 381/103, 312–331
See application file for complete search history.

(56) References Cited

U.S. PATENT DOCUMENTS

| | | | |
|---|---|---|---|
| 6,496,795 B1 * | 12/2002 | Malvar ........................... | 704/203 |
| 6,873,709 B2 * | 3/2005 | Hou ................................ | 381/106 |
| 2008/0130928 A1 * | 6/2008 | Barthel et al. ................ | 381/320 |
| 2009/0290737 A1 * | 11/2009 | Alfsmann ..................... | 381/320 |
| 2010/0128911 A1 * | 5/2010 | Elmedyb et al. ............. | 381/320 |
| 2011/0007918 A1 * | 1/2011 | Bauml et al. ................. | 381/320 |

FOREIGN PATENT DOCUMENTS

DE        69833749 T2    8/2006

OTHER PUBLICATIONS

"Bericht zur Untersuchung eines neuen Filterbank-Konzepts zur Anwendung in Hörgeräten"; Arbeitsgruppe Digitale Signalverarbeitung, Ruhr-Universität Bochum im Auftrag der Firma Siemens Audiologische Technik GmbH; Aug. 21, 2007; pp. 1-65.
"Dokumentation der Voruntersuchungen von Filterbänken zur Anwendung in Hörgeräten"; Arbeitsgruppe Digitale Sig0nalverarbeitung, Ruhr-Universität Bochum im Auftrag der Firma Siemens Audiologische Technik GmbH; May 4, 2007; pp. 1-52.
Göckler et al., "Multiratensysteme—Abtastratenumsetzung und digitale Filterbänke"; Schlembach Fachverlag, Willburgstetten 2004 (Inhaltsverzeichnis); Book; 2004; Table of Contents pp. 1-3.
Kammeyer, Kroschel, Teubner Verlag, Stuttgart 2002, Chapter 4.3.5; 2002; pp. 106-107.

* cited by examiner

*Primary Examiner* — Henry Choe

(57) ABSTRACT

The object of the invention is to make sub-band processing in hearing aids less computationally intensive. For this purpose a filter bank system comprising an analysis filter bank (AFB) for decomposing an input signal into sub-band signals, a processing device for amplifying at least one of the sub-band signals, and a synthesis filter bank (SFB) for combining the processed sub-band signals into an output signal is provided. The sub-band signals are oversampled and downsampled compared to the input signal. The stopband attenuations of the individual filters of the AFB and SFB are at least as high as a predefined signal-to-noise ratio increased by an attenuation value which is a function of the oversampling factor, the downsampling factor and possibly the gain. The magnitude frequency response of the SFB is approximately matched to the magnitude frequency response of the AFB.

14 Claims, 4 Drawing Sheets

FILTER BANK SYSTEM FOR HEARING AIDS

This application claims priority of German application No. 10 2008 024 490.2 filed May 21, 2008, which is incorporated by reference herein in its entirety.

FIELD OF THE INVENTION

The present invention relates to a filter bank system for a hearing aid.

BACKGROUND OF THE INVENTION

Hearing aids are portable hearing instruments serving to provide hearing assistance to the hearing-impaired. In order to meet the numerous individual requirements, different types of hearing aid are available, such as behind-the-ear (BTE) devices, hearing aids with external receiver (RIC: receiver in the canal) and in-the-ear (ITE) hearing aids, e.g. also concha or completely-in-canal (CIC) instruments. The hearing devices listed by way of example are worn on the outer ear or in the auditory canal. However, bone conduction hearing aids, implantable or vibrotactile hearing aids are also commercially available. In these cases, the damaged hearing is stimulated either mechanically or electrically.

The basic components of a hearing aid are essentially an input transducer, an amplifier and an output transducer. The input transducer is generally a sound pickup device, e.g. a microphone, and/or an electromagnetic pickup such as an induction coil. The output transducer is mainly implemented as an electroacoustic transducer, e.g. a miniature loudspeaker, or as an electromechanical transducer such as a bone conduction receiver. The amplifier is usually integrated in a signal processing unit. This basic design is shown in FIG. 1 using the example of a behind-the-ear hearing aid. Installed in a hearing aid housing 1 for wearing behind the ear are one or more microphones 2 for picking up sound from the environment. A signal processing unit 3 which is likewise integrated in the hearing aid housing 1 processes the microphone signals and amplifies them. The output signal of the signal processing unit 3 is transmitted to a loudspeaker or receiver 4 which outputs an audible signal. The sound is in some cases transmitted to the wearer's eardrum via a sound tube which is fixed in the auditory canal using an earmold. The hearing aid and in particular the signal processing unit 3 are powered by a battery 5 likewise integrated in the hearing aid housing 1.

Sound signals which are picked up by one or more microphones of a hearing aid are usually decomposed into sub-band signals for further processing. For this purpose, one or more frequency-selective digital analysis filter banks (AFBs) are normally used, thereby obtaining K>1 sub-band signals. After decomposition, sub-band-specific signal manipulations can be performed. In the case of hearing aids these are in particular amplifications in the individual sub-bands. The manipulated sub-band signals can subsequently be re-synthesized by means of a digital synthesis filter bank (SFB).

High-quality filter banks in hearing aids are subject to certain requirements. Thus, for example, in the lowest bands a channel bandwidth of approximately 250 Hz is required. Apart from that, the band spacing should more or less conform to the Bark scale. In addition, a channel number of at least 22 is desirable. Noise components caused by aliasing must be reliably below 60 dB. Because of the intensive sub-band processing (particularly the high amplification required for compensating for hearing impairment) in hearing aids, conventional methods for eliminating aliasing are ineffective. The filter banks must therefore be basically "non-critically" sampled. Moreover, the group delay (for both AFB and SFB) must be well below 5 ms and the group delay distortion must not exceed certain limits. Particularly for high frequencies, group delay must be kept as low as possible, which constitutes a significant limiting factor for the filter bank.

Publication DE 698 33 749 T2 discloses a filter bank arrangement and a method for filtering and separating an information signal in different frequency bands for audio signals in hearing aid devices. In an analysis filter bank, an input signal is decomposed into sub-band signals. The sub-band signals are amplified if necessary and combined into an output signal in a synthesis filter bank. The signals are oversampled in the analysis filter bank.

SUMMARY OF THE INVENTION

The object of the present invention is to make sub-band processing in hearing aids less computationally intensive.

This object is achieved according to the invention by a filter bank system for a hearing aid, comprising an analysis filter bank for decomposing an input signal into sub-band signals, a processing device for amplifying at least one of the sub-band signals, and a synthesis filter bank for combining the processed sub-band signals into an output signal, wherein the sub-band signals are oversampled in the analysis filter bank, the processing device and the synthesis filter bank with an oversampling factor U and downsampled compared to the input signal with a downsampling factor, the stopband attenuations of the individual filters of the analysis filter bank are at least as high as a predefined first signal-to-noise ratio increased by a first attenuation value which is a function of the oversampling factor U and downsampling factor, and/or those of the synthesis filter bank are at least as high as a predefined second signal-to-noise ratio increased by a second attenuation value which is a function of the oversampling factor U, the downsampling factor and the gain of the processing device, and the magnitude frequency response of the synthesis filter bank is approximately matched to the magnitude frequency response of the analysis filter bank such that the complex frequency response of the cascade of analysis filter bank and synthesis filter bank, bypassing the processing device, is approximately an all-pass transfer function.

By means of the specific stopband attenuations of the individual filters and magnitude frequency response matching, it is advantageously possible to reconstruct the downsampled sub-bands to produce a relatively undistorted output signal despite the typical hearing aid amplifications.

The AFB and the SFB are preferably each implemented as multistage filter banks for incrementally increasing the downsampling factor and upsampling factor respectively, thereby enabling different downsampling factors to be used in the individual sub-bands.

The AFB and/or the SFB can be specifically implemented as polyphase filter banks, wherein all the individual frequency responses of the filter banks are derived from a prototype filter by modulation in each case. This enables the filter banks to be designed without great complexity.

According to a development, the prototype filter of the AFB can possess a different stopband attenuation and/or a different attenuation and/or a different attenuation in the passband compared to the prototype filter of the SFB. The same high-quality stopband attenuation does not therefore need to be provided in both filter banks.

In addition, the AFB and the SFB can each constitute non-uniform filter banks, thereby enabling different sampling rates and oversampling factors respectively to be implemented in the sub-band signals.

At least one of the filter banks or a sub-filter bank of one of the filter banks can be minimum phase or linear phase. In the case of minimum phase, the relevant filter bank has low group delay and, in the case of linear phase, constant group delay.

The prototype filter used for the filter banks can likewise be minimum phase or linear phase, also resulting in low and constant group delay respectively.

In addition, the group delay of the individual filters of the filter banks can be essentially constant in the respective passband. Moreover, the group delay of the filters of the filter banks can be constant in a significant part of the transitional region from passband to stopband. The larger the region of constant group delay, the less distortion is likely to occur.

According to a particularly preferred embodiment, U polyphase branch filters (U=oversampling factor) of the prototype filter are fed with the same signal in each case, thereby providing a saving of numerous signal memories for implementing the filter banks.

BRIEF DESCRIPTION OF THE DRAWINGS

The present invention will now be explained in greater detail with reference to the accompanying drawings in which.

DETAILED DESCRIPTION OF THE INVENTION

The examples described in more detail below constitute preferred embodiments of the present invention.

Figure 1:
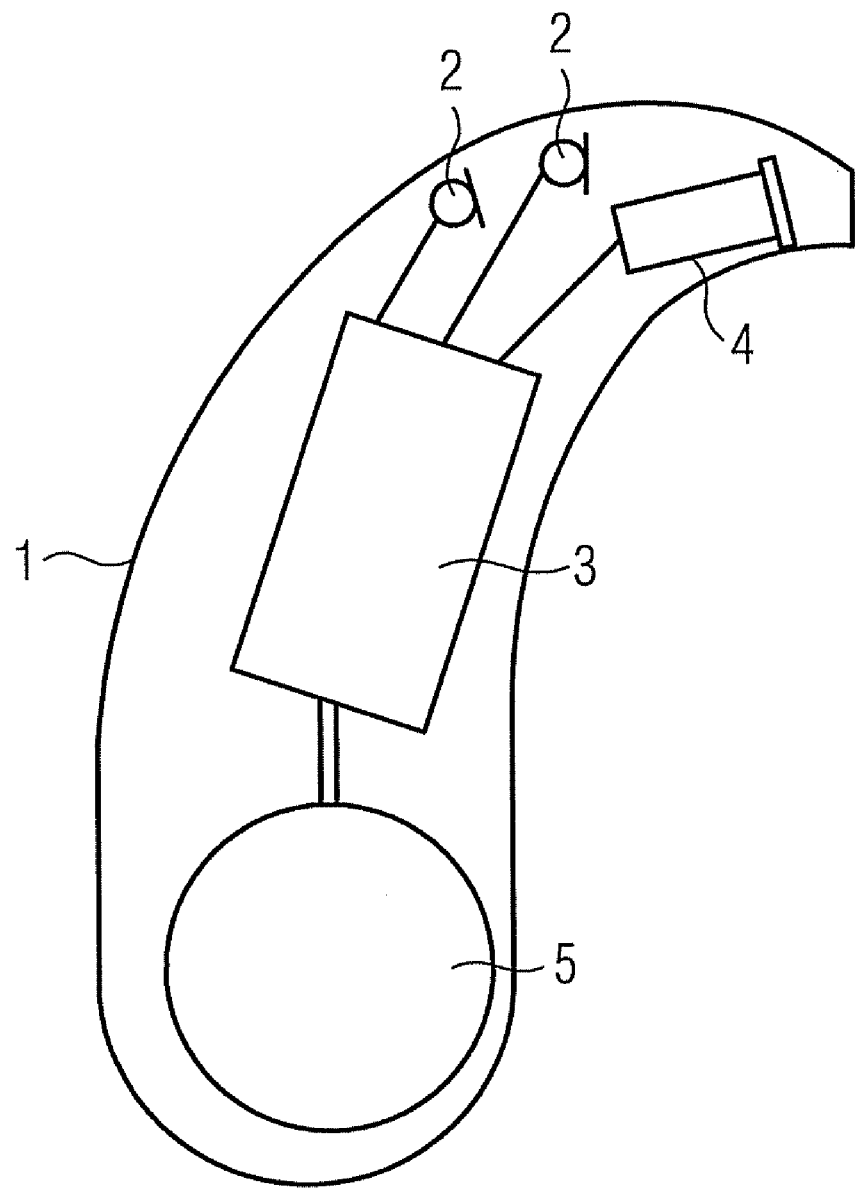
FIG. 1 shows the basic design of a hearing aid according to the prior art.
Figure 2:
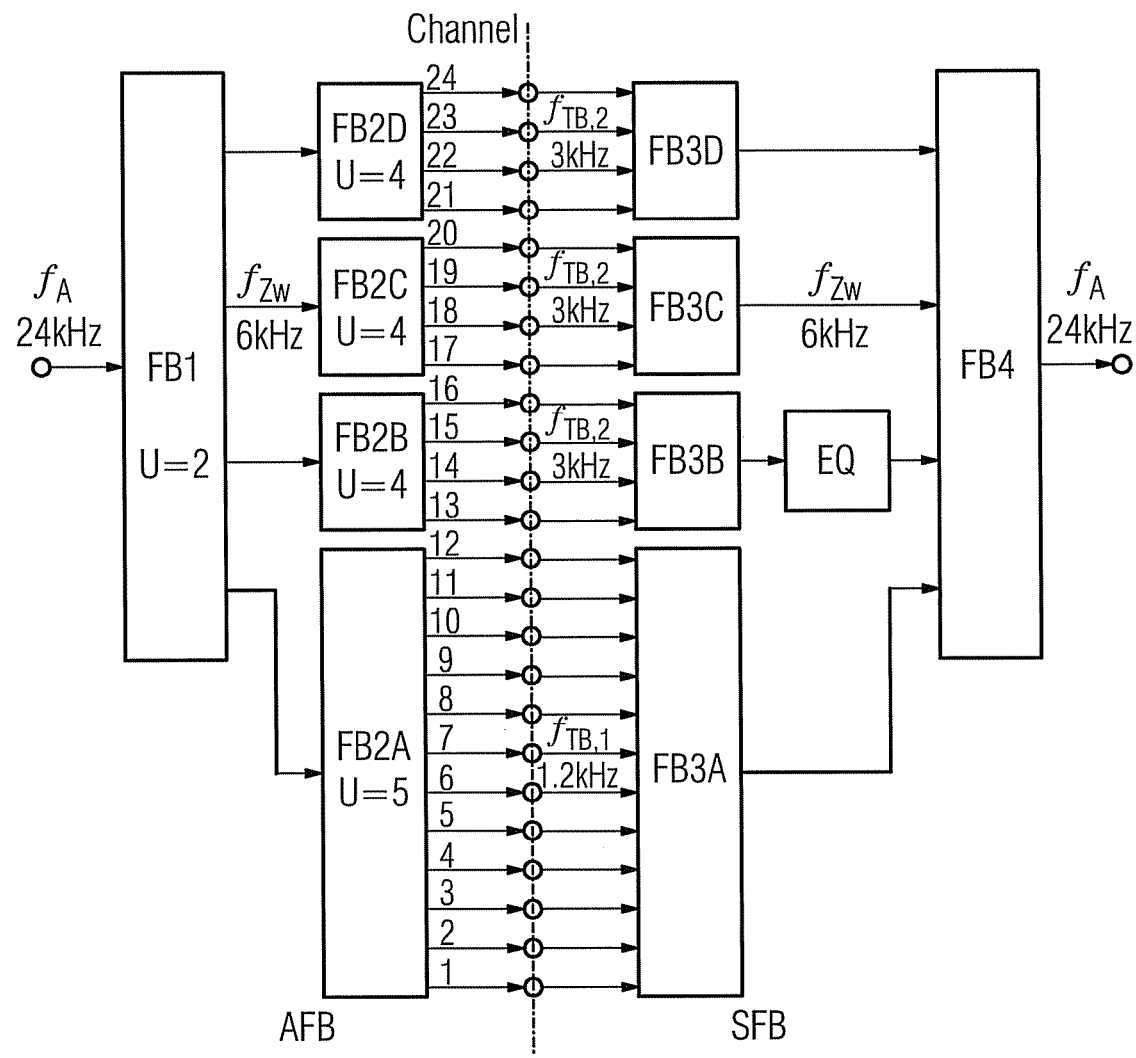
FIG. 2 shows a filter bank system according to the present invention.

FIG. 2 shows a filter bank system, in this case a filter bank cascade, consisting of a multistage analysis filter bank (AFB) and a multistage synthesis filter bank (SFB). The filter bank cascade in this example is used for signal processing in a hearing device and in particular in a hearing aid. The input-side filter bank (FB1) of the AFB decomposes the input signal into four channels. The output-side filter banks FB2A, FB2B, FB2C and FB2D further decompose the four channels into ultimately 24 channels, the lowest channel of the FB1 being decomposed by the FB2A into twelve channels, while the remaining three channels of the FB1 are each decomposed into four channels by means of the output filter banks FB2B, FB2C and FB2D. The input sampling rate of the FB1 is e.g. 24 kHz. The sampling rate between the two filter bank stages $f_{Zw}$ is 6 kHz in the example chosen. The sampling rate in the sub-band channels at the output of the AFB is in each case 3 kHz in the high frequency groups, i.e. after the filter banks FB2B, FB2C and FB2D. The sampling rate after the filter bank FB2A of the lower frequency group is 1.2 kHz. Downsampling with a downsampling factor of 8 and 20 respectively is therefore advantageously performed here.

After the AFB, sub-band-specific signal manipulation, in particular amplification, is performed, but not shown in FIG. 2. For the sake of clarity, in FIG. 2 the SFB is connected directly to the AFB for re-synthesis of the signal. The SFB is of symmetrical design to the AFB in respect of the filter banks in the individual stages. Consequently, the lowest stage of the SFB contains the filter banks FB3A, FB3B, FB3C and FB3D which combine twelve and four sub-band signals respectively into one signal. The four resulting signals with a sampling rate of 6 kHz are fed to the higher synthesis stage FB4 which combines the signals into an output signal with a sampling rate of 24 kHz.

The wider filter banks FB2A and FB3A in the lower frequency group here also produce an increased group delay $\tau_g$ compared to the next higher frequency group with the narrower filter banks FB2B and FB3B. The filter bank FB3B is therefore followed by an equalizing filter (equalizer EQ). Said equalizer EQ increases the group delay of the filter bank FB3B at the upper (higher frequency) band edge to the value of the group delay of the filter bank FB3A at its lower band edge.

FIG. 2 also shows that an oversampling factor U=2 has been selected in the filter bank stage FB1 of the analysis filter bank. The oversampling factors in the second stage are 4 or 5 as the case may be. With the filter bank structure thus selected, for example, an approximately 12 kHz wide input signal can be decomposed into 12 channels of 240 Hz bandwidth (channels 1 to 12) and into 12 channels of 750 Hz bandwidth (channels 13 to 24).

The filter bank structure of the analysis filter bank as shown in FIG. 2 is optimized with respect to group delay and energy consumption. This AFB filter bank structure has an input-side and an output-side filter bank based on a predefined filter type and can be determined as follows. The input-side filter bank possesses, as a variable first parameter, a channel number and, as a variable second parameter, an oversampling factor. For optimizing the multistage filter bank, a group delay and an operation rate are now determined for a plurality of value pairs of the first and second parameter. From the value pairs, the one for which the associated group delay and the associated operation rate fulfill a predefined criterion, in particular are as low as possible, is selected. The input-side filter bank is then configured with the channel number and the oversampling factor corresponding to the value pair selected. The SFB is designed symmetrically to the AFB, apart from the equalizer EQ which can be optionally used.

The sub-band signals in the channels 1 to 24 of the AFB, the SFB and the intervening processing device are therefore sampled with a predefined oversampling factor U and downsampled compared to the input signal with a downsampling factor (in this case 20 in the channels 1 to 12, and 8 in the channels 13 to 24).

Figure 3:
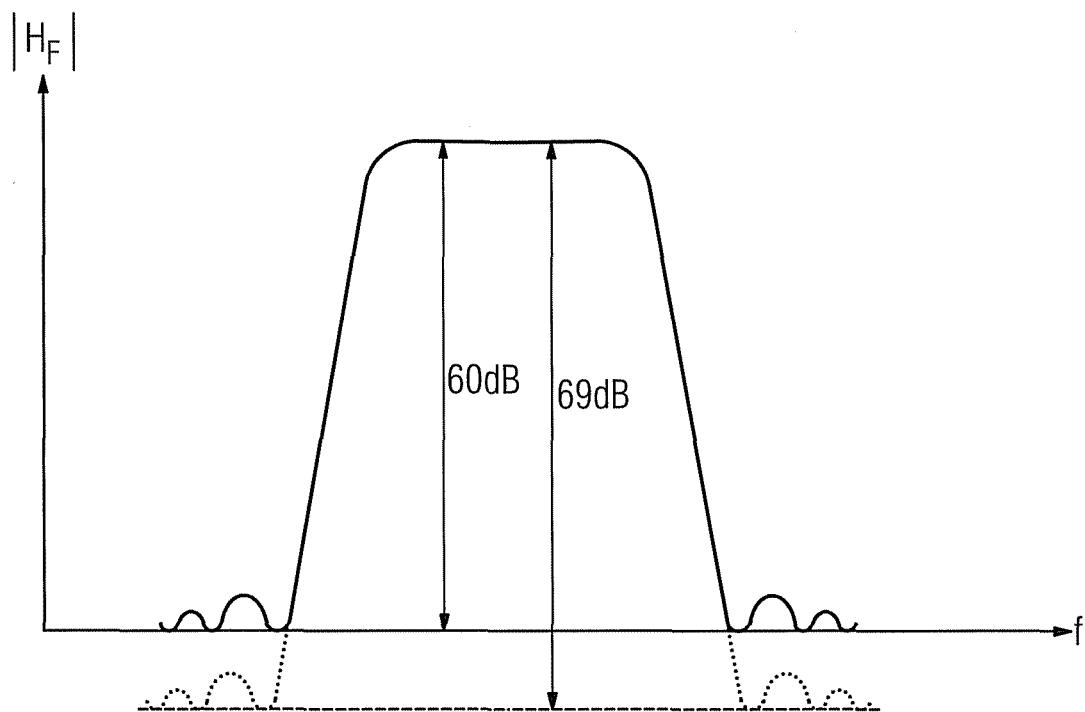
FIG. 3 shows the magnitude frequency response of a bandpass filter of one of the filter banks.

The individual filters of the AFB possess a sufficiently high stopband attenuation in order to prevent nonlinear signal noise due to aliasing. In particular, the stopband attenuation is at least as high as a desired signal-to-noise ratio. In this connection, FIG. 3 plots the magnitude frequency response of a filter. If, for example, the signal-to-noise ratio shall be 60 dB and there is no other aliasing noise, the stopband attenuation of the filter can be 60 dB. However, if other noise caused by aliasing components is to be expected, the stopband attenuation must be increased accordingly. For example, the stopband attenuation can be increased by 3 dB per expected aliasing component. The number of aliasing components to be expected can be determined in the usual manner from the oversampling factor and the downsampling factor. In the example in FIG. 3, three additional aliasing components are expected, so that the stopband attenuation is increased by 3·3 dB=9 dB to 69 dB in total.

Additionally or possibly also only alternatively, the filters of the SFB can be provided with sufficiently high stopband attenuation. Here the starting point is once again the desired signal-to-noise ratio which, however, may differ from the signal-to-noise ratio of the filters of the AFB. The stopband attenuation is again increased by an appropriate attenuation value derived from the oversampling factor and the downsampling factor. However, in the case of the SFB it must also be noted that, in the hearing aid signal processing device, signal amplification is provided at least in some sub-bands. Therefore, unwanted components, in particular imaging components, produced during upsampling may also be amplified accordingly. These must likewise be sufficiently attenuated. Consequently, the stopband attenuation of the filters in the SFB is also increased as a function of the gain of the processing device, thereby also enabling nonlinear signal noise due to imaging of the SFB to be prevented. However, phase matching of the SFB to the AFB to eliminate aliasing does not expressly take place, nor is this useful in a hearing aid application.

In addition, according to the present invention, the magnitude frequency response of the SFB is approximately matched to the magnitude frequency response of the AFB, which makes the complex-valued frequency response of the cascade of AFB and SFB, bypassing the processing device, approximately an all-pass transfer function. The word "approximately" relates to the usual term NPMR (Near Perfect Magnitude Reconstructions), i.e. no PMRs (Perfect Magnitude Reconstructions) are to be performed here, as this must not be the case because of the amplification in sub-bands of the hearing aid. That is to say, PMR would result in a transparent system with a constant transfer factor of 1, i.e. without amplification. Perfect reconstruction in other respects usual for filter banks, with appropriate aliasing compensation which can be derived purely mathematically, cannot therefore be selected. Instead, appropriate oversampling and a sufficiently high stopband attenuation must be selected here to prevent noise. The magnitude frequency response of the filter bank system must be optimized accordingly on this basis.

Figure 4:
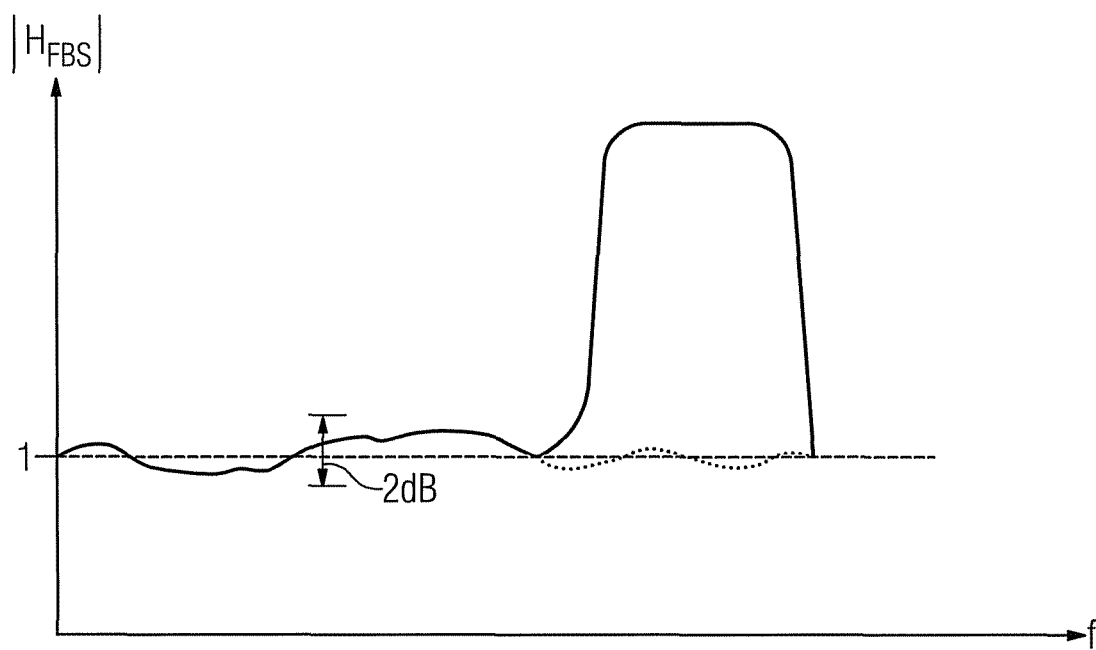
FIG. 4 shows the magnitude frequency response of the filter bank system.

FIG. 4 shows the magnitude frequency response $|H_{FBS}|$ of a filter bank system in which the magnitude frequency response of the SFB is matched to the magnitude frequency response of the AFB so as to produce approximately an all-pass filter when the hearing aid amplification is 1. Specifically, FIG. 4 shows the magnitude frequency response of a hearing aid for high tone amplification. Here amplification takes place only in the higher channels. If said amplification is prevented, this produces a transparent system with approximately the same gain factor 1 over the entire frequency range (cf. dashed curve in the higher frequency range in FIG. 4). However, the filter bank structure results in certain fluctuations in the magnitude frequency response. This does not therefore constitute a mathematically perfect reconstruction of the input signal. Rather, the filter bank cascade reconstructs the magnitude spectrum of the input signal only in a near-perfect manner. The fluctuation range is, for example, 2 dB.

Variants of the inventive filter bank system which can result in further optimizations will now be presented. For example, the AFB and/or the SFB can basically be implemented as a single- or multistage filter bank for incrementally increasing/reducing the sampling rate. It is also advantageous if the AFB and/or the SFB are implemented as (complex- or real-value modulated) polyphase filter banks wherein all the individual frequency responses of the filter banks are derived from a prototype filter by modulation in each case. In order to implement the filter banks with only moderate overhead, the computationally favorable, uniform, complex-modulated (using discrete Fourier transformation) polyphase filter banks with oversampling with the factor U are used (cf. Heinz Göckler and Alexandra Groth "Multiratessysteme" (Multi-rate systems), published by Schlemmbachverlag, Willburgstätten, 2004). With these polyphase filter banks, only one prototype filter is required for all the filter bank channels, and the frequency shift is implemented by means of the efficient FFT realization of the DFT.

In addition, the AFB and SFB can be implemented as uniform or non-uniform filter banks with the same or different bandwidth of the individual filter bank channels, wherein in the case of non-uniform filter banks the sub-band signals can have different sampling rates and/or different oversampling factors. Moreover, the prototype filter used for the AFB can have a different stopband attenuation and/or a different frequency response in the passband from that of the prototype filter of the SFB.

At least one of the (sub-)filter banks of the filter bank system can be minimum phase, i.e. the zeros of the Z-transform of the filter bank transfer function are inside the unit circle. The advantage of this is that the group delay is then relatively low. The prototype filter itself can also be minimum phase, it also being advantageous if the group delay of the prototype filter of the corresponding filter bank is approximately constant in the filter passband and possibly also in parts of the filter transitional region to the stopband, thereby enabling any distortions to be reduced.

Alternatively, at least one of the (sub-)filter banks or a prototype filter of said filter banks can also be linear phase, resulting in constant group delay which may be advantageous in some circumstances.

In addition, the filter banks or more specifically the prototype filters can be implemented non-recursively (FIR filter) or recursively (IIR filter). Optionally, the filter banks or prototype filters can be partly FIR and partly IIR type. In the case of IIR filters, the frequency response can correspond to that of a minimum-phase Butterworth filter or that of a minimum-phase inverse type 2 Chebyshev filter.

Particular advantages result from using oversampling with the factor U in terms of saving on signal memories when implementing the filter banks with FIR prototype filters. In particular, U polyphase branch filters $h_1, h_5, h_9, \ldots, h_{45}$ of the FIR prototype filter are each fed the same input signal (such as one of the polyphase components pk1, pk2, pk3 and pk4 of the input signal) (cf. FIG. 5). U branch filters can therefore use the same set of signal memories (each denoted by $z_0^{-1}$ in FIG. 5). Therefore, instead of U signal memory chains for U branch filters, only a single memory chain is required.

Figure 5:
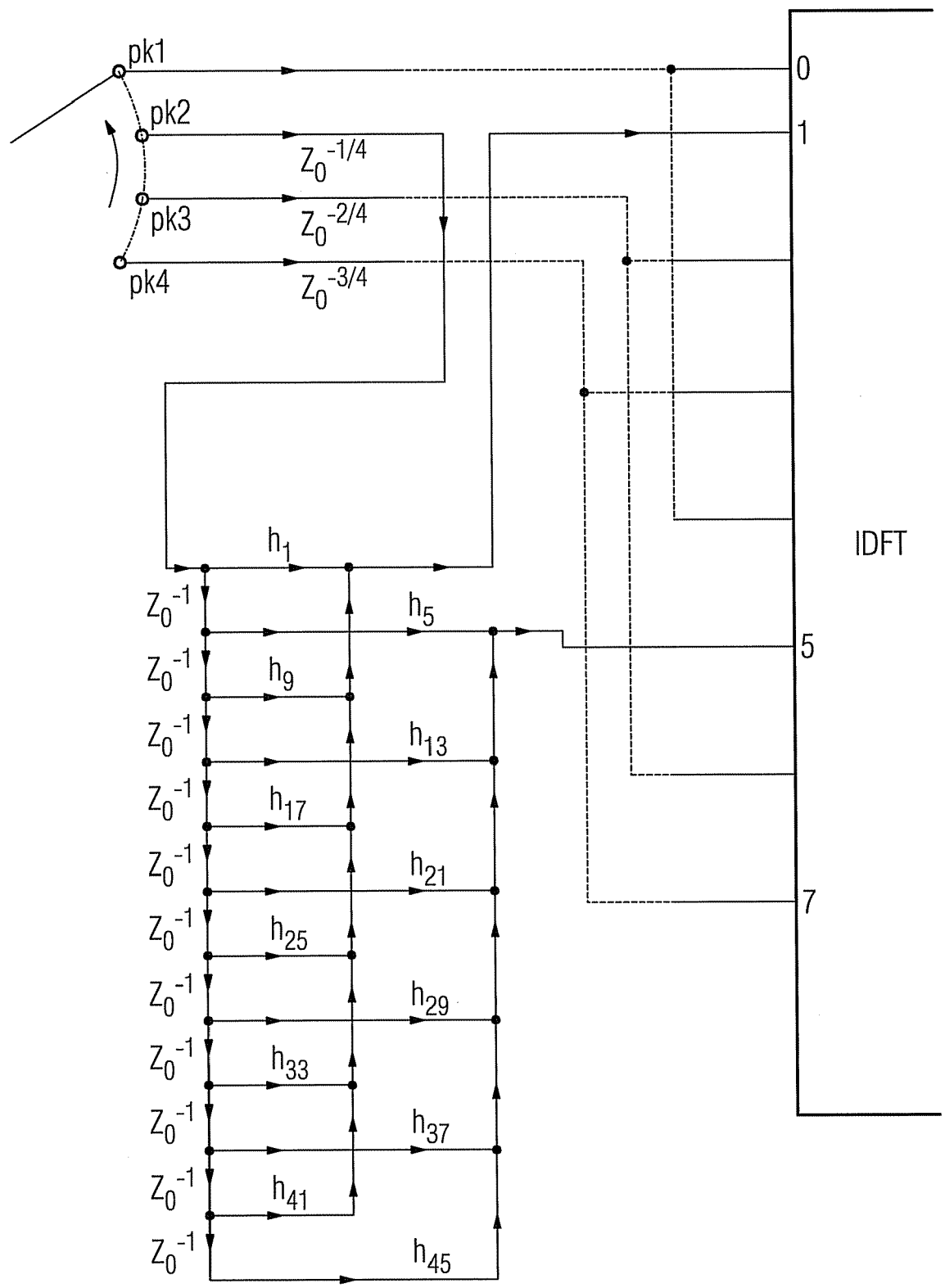
FIG. 5 shows the design of a filter with a reduced number of memories.

In the specific case of the example in FIG. 5, the oversampling factor is two, because eight components corresponding to the inputs 0 to 7 of the IDFT module are obtained from the four polyphase components pk1 to pk4 for the inverse discrete Fourier transformation. Specifically, as shown in FIG. 5, the first and fifth components are obtained for the IDFT from the polyphase component pk2 using a single signal memory chain ($z_0^{-1}$ chain). The same saving is possible for the corresponding filters of the SFB, as its structure is basically traceable to AFB structures by transposition (cf. Heinz Göckler and Andrea Groth, loc. cit.).

The invention claimed is:

1. A filter bank system for a hearing aid, comprising:
    an analysis filter bank comprising a plurality of analysis filters for decomposing an input signal into sub-band signals;
    a processing device for processing the sub-band signals; and
    a synthesis filter bank comprising a plurality of synthesis filters for combining the sub-band signals into an output signal,
    wherein the sub-band signals are configured to be oversampled with an oversampling factor and downsampled with a downsampling factor, wherein stopband attenuations of the analysis filters are configured to be at least as high as a predefined first signal-to-noise ratio increased by a first attenuation value which is a function of the oversampling factor and the downsampling factor, wherein stopband attenuations of the synthesis filters are configured to be at least as high as a predefined second signal-to-noise ratio increased by a second attenuation value which is a function of the oversampling factor, the downsampling factor and a gain of the processing device, and wherein a magnitude of frequency response of the synthesis filter bank is configured to be matched to a magnitude of frequency response of the analysis filter bank so that a complex-valued frequency response of cascades of the analysis filter bank and the synthesis filter bank bypassing the processing device is an all-pass transfer function.

2. The filter bank system as claimed in claim 1, wherein the analysis filter bank and the synthesis filter bank are multistage filter banks for incrementally increasing the downsampling factor and the oversampling factor.

3. The filter bank system as claimed in claim 1, wherein the analysis filter bank and the synthesis filter bank are polyphase filter banks.

4. The filter bank system as claimed in claim 3, wherein a frequency input of the analysis filter bank and a frequency input of the synthesis filter bank are derived from a prototype filter of the analysis filter bank and a prototype filter of the synthesis filter bank by modulation.

5. The filter bank system as claimed in claim 4, wherein the prototype filter of the analysis filter bank has a stopband attenuation that is different from a stopband attenuation of the synthesis filter bank.

6. The filter bank system as claimed in claim 4, wherein the prototype filter of the analysis filter bank has a passband attenuation that is different from a passband attenuation of the synthesis filter bank.

7. The filter bank system as claimed in claim 4, wherein the prototype filter of the analysis filter bank and the prototype filter of the synthesis filter bank are minimum phase or linear phase.

8. The filter bank system as claimed in claim 4, wherein the prototype filter of the analysis filter bank and the prototype filter of the synthesis filter bank are fed with identical signals.

9. The filter bank system as claimed in claim 1, wherein the analysis filter bank and the synthesis filter bank are non-uniform filter banks.

10. The filter bank system as claimed in claim 1, wherein the analysis filter bank or the synthesis filter bank is minimum phase or linear phase.

11. The filter bank system as claimed in claim 1, wherein at least one of the analysis filters and one of the synthesis filters is minimum phase or linear phase.

12. The filter bank system as claimed in claim 1, wherein a group delay of the analysis filters and the synthesis filters is constant in a passband.

13. The filter bank system as claimed in claim 1, wherein a group delay of the analysis filters and the synthesis filters is constant in a part of a transitional region from a passband to a stopband.

14. A method for processing an input signal of a hearing aid, comprising:
  decomposing the input signal into sub-band signals by an analysis filter bank comprising a plurality of analysis filters;
  processing the sub-band signals by a processing device; and
  combining the sub-band signals into an output signal by a synthesis filter bank comprising a plurality of synthesis filters,
wherein the method further comprising:
  oversampling the sub-band signals with an oversampling factor;
  downsampling the sub-band signals with a downsampling factor;
  setting stopband attenuations of the analysis filters at least as high as a predefined first signal-to-noise ratio increased by a first attenuation value which is a function of the oversampling factor and the downsampling factor;
  setting stopband attenuations of the synthesis filters at least as high as a predefined second signal-to-noise ratio increased by a second attenuation value which is a function of the oversampling factor, the downsampling factor and a gain of the processing device, and
  matching a magnitude of frequency response of the synthesis filter bank to a magnitude of frequency response of the analysis filter bank so that a complex-valued frequency response of cascades of the analysis filter bank and the synthesis filter bank bypassing the processing device is an all-pass transfer function.

* * * * *